United States Patent [19]

Jokura

[11] Patent Number: 5,422,604
[45] Date of Patent: Jun. 6, 1995

[54] LOCAL OSCILLATION FREQUENCY SYNTHESIZER FOR VIBRATION SUPPRESSION IN THE VICINITY OF A FREQUENCY CONVERGING VALUE

[75] Inventor: Jun Jokura, Tokyo, Japan

[73] Assignee: NEC Corporation, Tokyo, Japan

[21] Appl. No.: 163,125

[22] Filed: Dec. 7, 1993

[51] Int. Cl.6 .............................................. H03L 7/07
[52] U.S. Cl. ........................................ 331/2; 331/17;
  331/25; 331/46; 455/260
[58] Field of Search .................. 331/20, 25, 46, 48,
  331/17; 328/14, 155; 455/260, 265, 183.1, 183.2

[56] References Cited

U.S. PATENT DOCUMENTS

| | | | |
|---|---|---|---|
| 3,588,730 | 6/1971 | Schreuer et al. | 331/2 |
| 4,940,950 | 7/1990 | Helfrick | 331/2 |
| 4,965,533 | 10/1990 | Gilmore | 331/18 |
| 4,994,762 | 2/1991 | Tay | 331/2 |

OTHER PUBLICATIONS

Patent Abstracts of Japan, vol. 10, No. 129 (E-403) May 14, 1986; JP A 60 261 220, Dec. 24, 1985.

*Primary Examiner*—Robert J. Pascal
*Assistant Examiner*—David Vu
*Attorney, Agent, or Firm*—Ostrolenk, Faber, Gerb & Soffen

[57] ABSTRACT

A local oscillation frequency synthesizer has first and second phase locked loop synthesizers for providing first and second oscillation frequency signals. The local oscillation frequency synthesizer also includes a controller which increases a frequency of the first oscillation frequency signal by a predetermined frequency amount corresponding to the change-over of channels and thereafter decreases the frequency of the first oscillation frequency signal to its original frequency. The controller also increases a frequency of the second oscillation frequency signal after the increase of the first oscillation frequency signal without thereafter decreasing the second oscillation frequency signal to its original frequency. The first and second frequency signals controlled in this manner are combined to form an output frequency signal such that the lowest level in the vibration of the first oscillation signal occurs at the same time that the highest level of the second oscillation signal occurs so that the vibrations of the first and second oscillation signals cancel each other out. Thus, the output oscillation signal resulting from the combination of the first and second oscillation frequency signals has a suppressed vibration disturbance.

2 Claims, 4 Drawing Sheets

5,422,604

LOCAL OSCILLATION FREQUENCY SYNTHESIZER FOR VIBRATION SUPPRESSION IN THE VICINITY OF A FREQUENCY CONVERGING VALUE

FIELD OF THE INVENTION

This invention relates to a local oscillation synthesizer, and more particularly to, a device for achieving high speed change-over of a frequency in a local oscillation frequency synthesizer.

BACKGROUND OF THE INVENTION

A conventional local oscillation frequency synthesizer comprises a reference frequency generator for generating a reference frequency, a voltage controlled oscillator for generating a frequency dependent on a voltage applied thereto, a frequency divider for dividing the frequency of the voltage controlled oscillator by a predetermined number, a phase comparator for comparing phases of the reference frequency and the divided frequency, a charge pump for generating first and second voltages dependent on a phase difference in the phase comaprator, and a loop filter for applying an integrated value of the first and second voltages to the voltage controlled oscillator.

In operation, the reference frequency generator generates a reference frequency suited for a selected channel, and the reference frequency and a divided frequency supplied from the frequency division circuit are compared in phase by the phase comparator, so that a phase difference signal is generated therein. Then, the charge pump generates a voltage dependent on the phase difference signal, and the voltage is integrated in the loop filter, so that an integrated voltage is applied to the voltage controlled oscillator, from which a frequency dependent on the integrated voltage is supplied to the frequency division circuit. Consequently, a controlled carrier frequency is obtained in the voltage controlled oscillator.

In this conventional local oscillation synthesizer, capacitors are connected to outputs of the phase comparator to result in the expansion of the dead zone for phase comparison thereby improving a C/N value. In other words, a carrier frequency is changed in high speed, in the case where a gain of the loop system is high. For this purpose, the parameters such as a frequency division ratio, a property of the loop filter, etc. should be selected to achieve the above-noted high speed carrier frequency change in the loop system having high gain. When the gain is heightened in accordance with the property of the loop filter, a noise band becomes wide, so that the sensitivity of the phase difference signal becomes high, while noise tends to be introduced into the loop system. The introduction of noise into the loop system causes deterioration of a C/N The deterioration of the C/N value is conventionally overcome by providing the aforementioned capacitors.

In the conventional local oscillation synthesizer, however, there is a disadvantage in that a carrier frequency fluctuates up and down which results in the tailing-of vibrations in the vicinity of a converging value, because the dead zone for phase comparison is expanded.

SUMMARY OF THE INVENTION

Accordingly, it is an object of the invention to provide a local oscillation frequency synthesizer in which vibration is small in the vicinity of a frequency converging value when changing-over a frequency, even in the case where a dead zone for phase comparison is expanded to improve a C/N value of an output signal.

It is a further object of the invention to provide a local oscillation frequency synthesizer in which a system gain is set to be high.

It is a still further object of the invention to provide a local oscillation frequency synthesizer in which a frequency is stably changed over with high speed.

According to the invention, a local oscillation frequency synthesizer, comprises:

first and second PLL synthesizers for generating first and second frequency signals;
a signal coupler for combining the first and second frequency signals to provide an output frequency signal; and
means for controlling the first and second PLL synthesizers to change the first and second frequency signals by a frequency-change amount corresponding to a change-over of channels, the first frequency signal being changed for a predetermined instant period by the frequency-change amount, and restored to an original frequency thereafter, while the second frequency signal being changed at a predetermined time after changing the first frequency signal by the frequency-change amount without restoring the second frequency signal to its original frequency.

BRIEF DESCRIPTION OF THE DRAWINGS

The invention will be explained in more detail in conjunction with appended drawings, wherein.

DETAILED DESCRIPTION OF THE PREFERRED EMBODIMENTS

Before explaining a local oscillation frequency synthesizer in the preferred embodiment, the aforementioned conventional local oscillation frequency synthesizer will be explained in FIG. 1.

Figure 1:
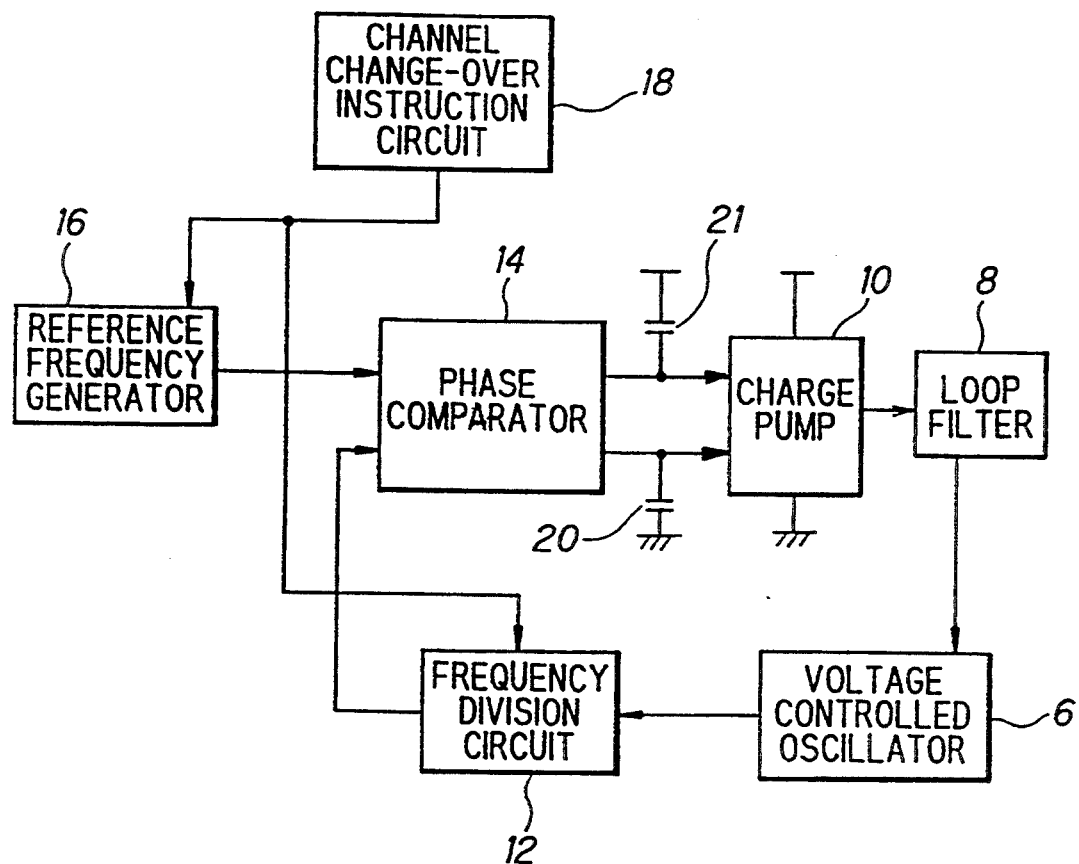
FIG. 1 is a block diagram showing a conventional local oscillation frequency synthesizer.

In the conventional local oscillation frequency synthesizer as shown in FIG. 1, a reference frequency from a reference frequency generator 16 and a frequency-divided signal from a frequency division circuit 12 are supplied to a phase comparator 14, in which the comparison of phases is carried out to provide a phase difference signal to be supplied to a charge pump 10.

Then, the charge pump 10 is driven to supply a controlled voltage dependent on the phase difference signal via a loop filter 8 to a voltage controlled oscillator 6, in which a carrier frequency is generated dependent on the controlled voltage. The carrier frequency is divided in the frequency division signal supplied from a channel change-over instruction circuit 18. The division signal is also utilized as a channel signal to be supplied to the reference frequency generator 16.

In this conventional local oscillation frequency synthesizer, a gain of the loop must be high to change-over frequencies with high speed.

For this purpose, the frequency division ratio and a property of the loop filter 8 must be modified. If the property of the loop filter 8 is changed, a noise band width becomes wide to increase the sensitivity of the phase difference signal, resulting in noise being easily introduced into the system which causes deterioration of a C/N value of an oscillation output. To overcome this disadvantage, capacitors 20 and 21 are provided at the outputs of the phase comparator 14 to expand a dead zone, that is, a band for no sensitivity, thereby improving a C/N value. In practice, however, this is an undesirable modification for the reason discussed above.

Figure 2:
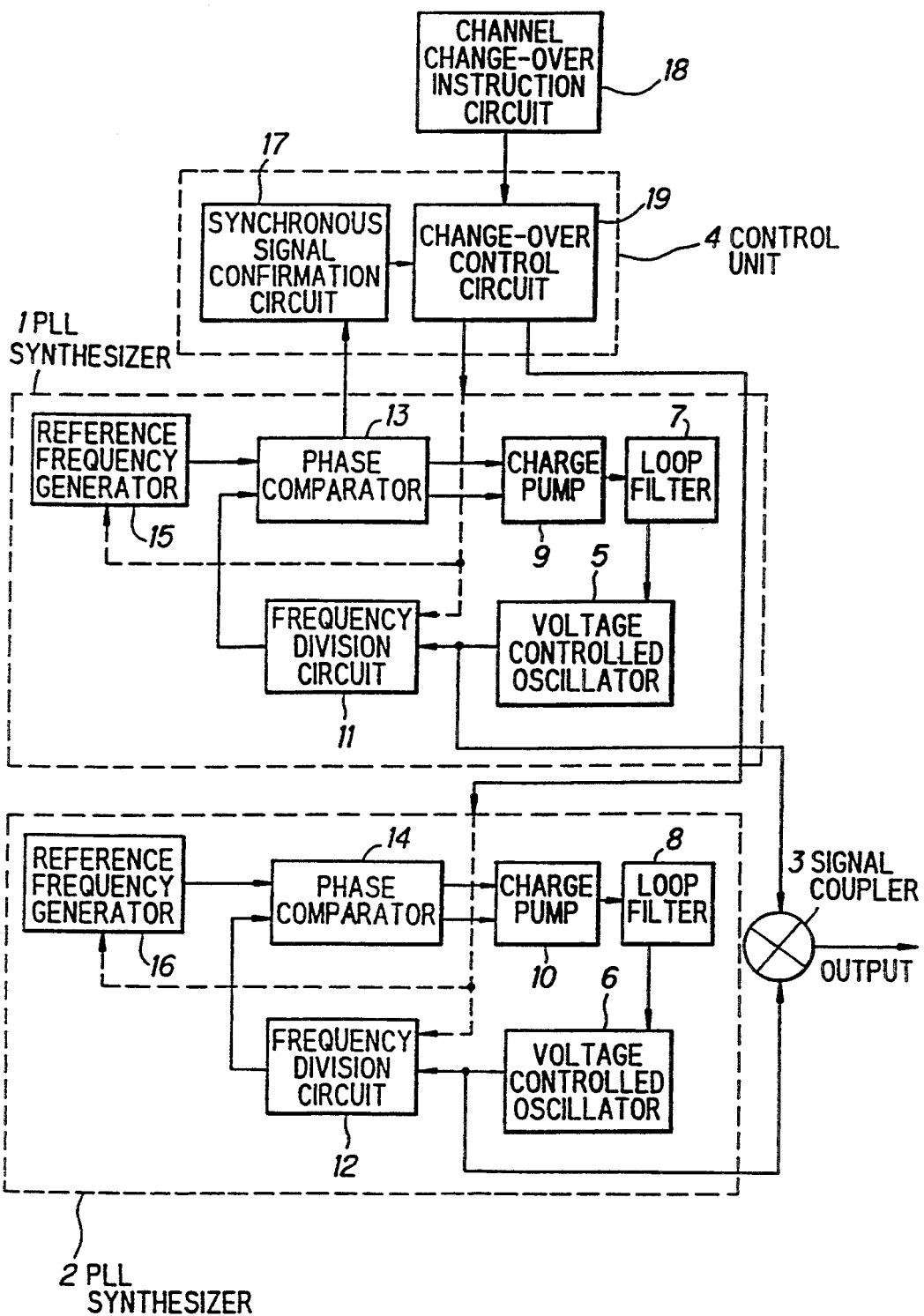
FIG. 2 is a block diagram showing a local oscillation frequency synthesizer according to a preferred embodiment of the present invention.

Next, a local oscillation frequency synthesizer in the preferred embodiment will be explained in FIG. 2.

The local oscillation frequency synthesizer comprises phase locked loop (PLL) synthesizer units 1 and 2, a signal coupler 3 for combining signals supplied from the PLL synthesizer units 1 and 2, a control unit 4 for controlling the PLL synthesizer units 1 and 2, and a channel change-over instruction circuit 18.

The PLL synthesizer unit 1 comprises a voltage controlled oscillator 5, a loop filter 7, a charge pump 9, a frequency division circuit 11, a phase comparator 13, and a reference frequency generator 15. The PLL synthesizer unit 2 comprises a voltage controller 6, a loop filter 8, a charge pump 10, a frequency division circuit 12, a phase comparator 14, and a reference frequency generator 16. The control unit 4 comprises a synchronous signal confirmation circuit 17 and a change over control circuit 19.

Figure 3:
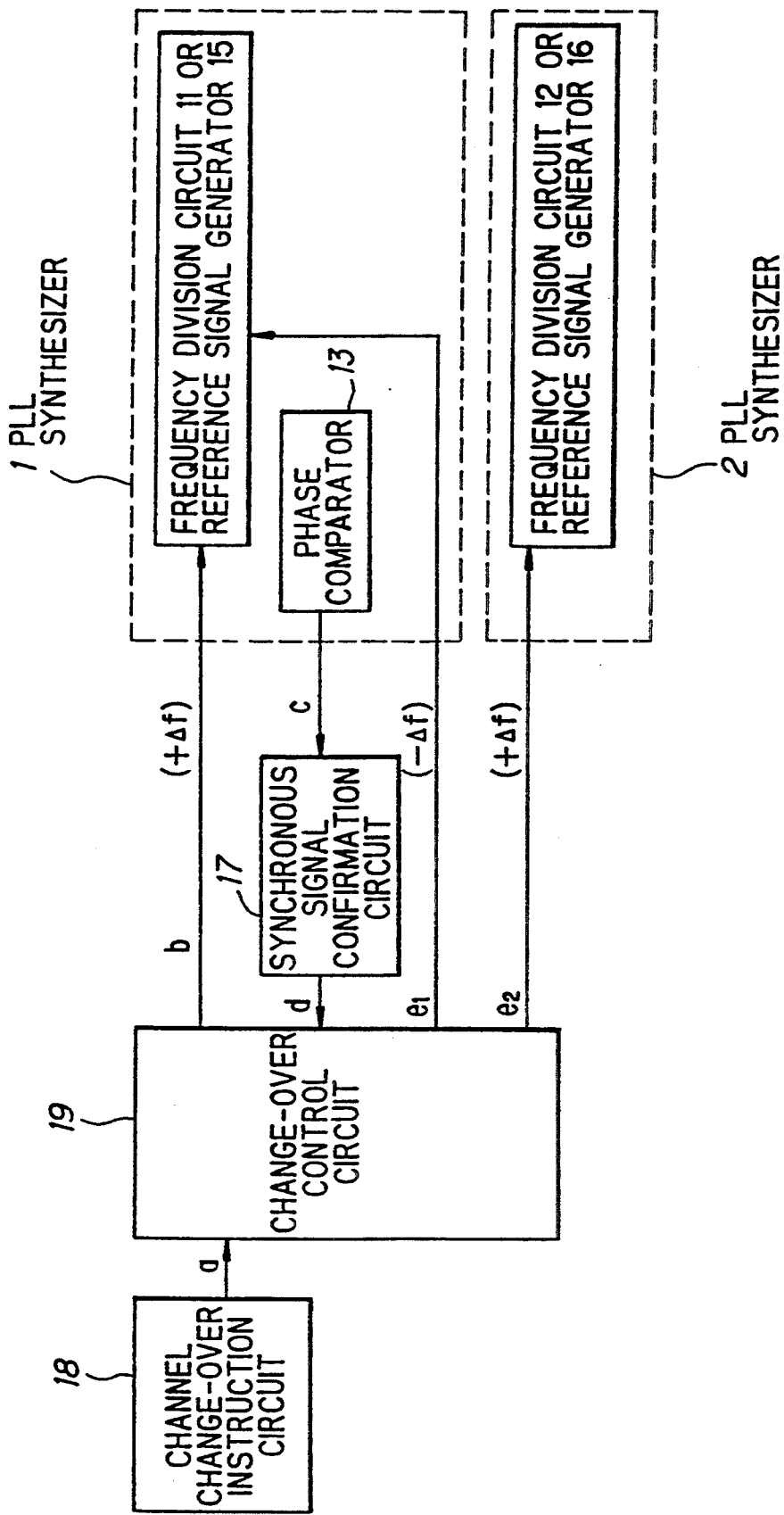
FIG. 3 is a block diagram showing the flow of control signals in the preferred embodiment.

In operation, a channel change-over signal a (FIGS. 3 and 4) is generated in the channel change-over instruction circuit 18, so that the change-over signal a is supplied to the change-over control circuit 19, from which a control signal b (FIGS. 3 and 4) is supplied to the PLL synthesizer unit 1. Thus, a carrier frequency $f_1$ is increased in the PLL synthesizer unit 1 by $\Delta f$. Then, when the phase is pulled into a predetermined phase, the phase comparator 13 generates a synchronous signal c (FIG. 3) to be supplied to the synchronous signal confirmation circuit 17, in which it is confirmed that a carrier frequency is coarsely adjusted to be "$f_1 + \Delta f$" so that a confirmation signal d (FIG. 3) is supplied therefrom to the change over control circuit 19. Then, the change-over control circuit 19 supplies the PLL synthesizer units 1 and 2 with control signals $e_1$ and $e_2$ (FIGS. 3 and 4), by which a carrier frequency "$f_1 + \Delta f$" is decreased by $\Delta f$ in the PLL synthesizer unit 1 to be returned to value of "$f_1$" by $\Delta f$, while a carrier frequency $f_2$ is increased by $\Delta f$ in the PLL synthesizer unit 2 to be "$f_2 + \Delta f$".

Figure 4:
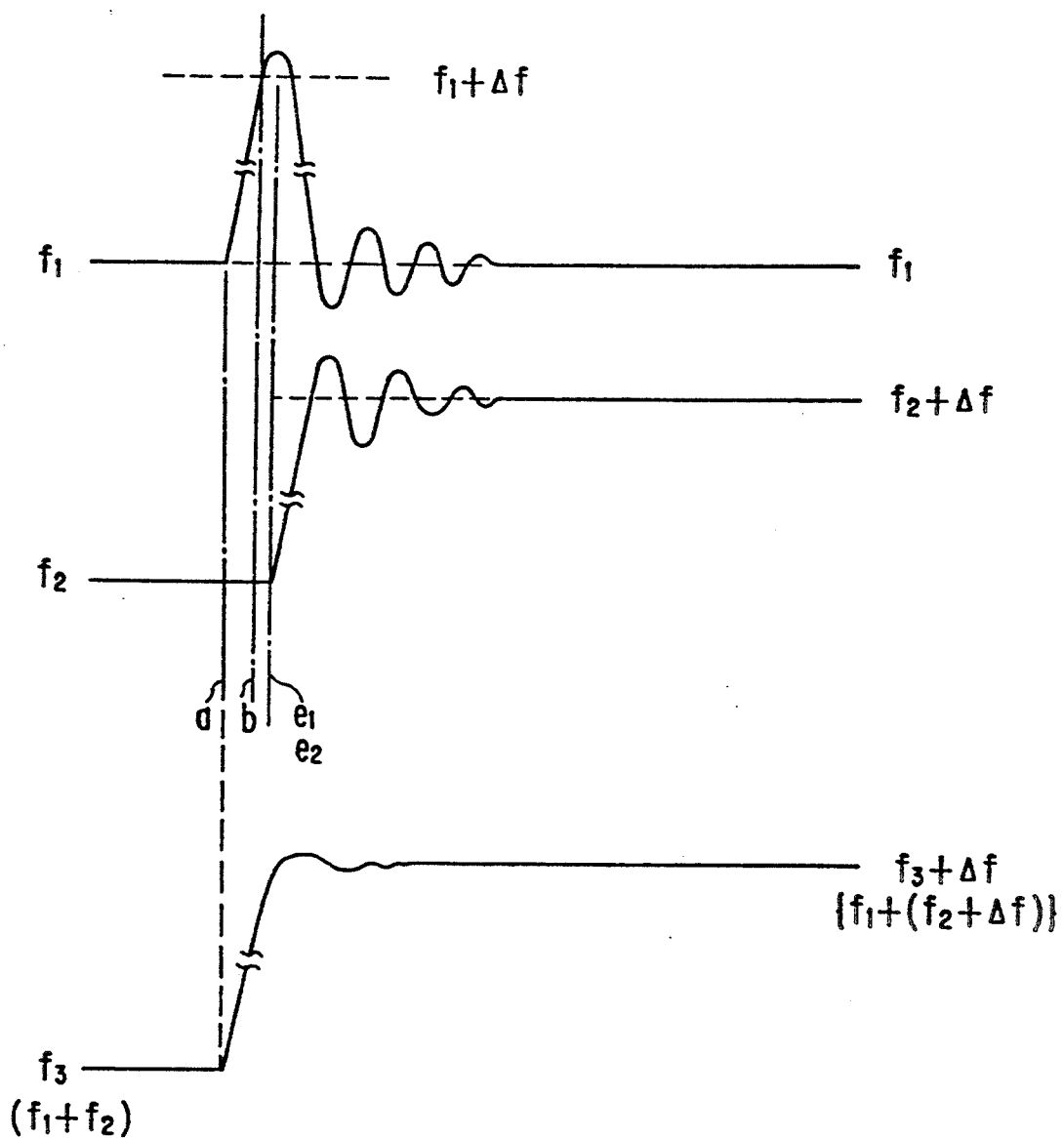
FIG. 4 is a waveform diagram showing the change of oscillation frequencies in the preferred embodiment.

Consequently, the carrier frequency $f_1$ from the PLL synthesizer unit 1 and the carrier frequency "$f_2 + \Delta f$" from the PLL synthesizer unit 2 are combined in the signal coupler 3 to provide a carrier frequency "$f_3 + \Delta f$" ($f_3 = f_1 + f_2$) as shown in FIG. 4. In this manner, the channel synchronism is set up.

As clearly seen in FIG. 4, vibrations of the signals "$f_1$" and "$f_2 + \Delta f$" have symmetrical modes in the vicinity of the respective converging values, so that the vibrations canceled each other to suppress the disturbance of the output signal "$f_3 + \Delta f$".

As explained above, a local oscillation frequency is divided into first and second local oscillation frequencies in the PLL synthesizer units 1 and 2, so that a ratio between an oscillation frequency and a channel interval becomes small, and a division ratio of a frequency from the voltage controlled oscillator is lowered. Thus, a gain of the system is enhanced, and the change-over of frequencies is carried out with high speed.

In the invention, it is important that a time between the control signals a and b is set to cancel the vibrations of the carrier frequencies "$f_1$" and "$f_2 + \Delta f$" as shown in FIG. 4.

In the invention, first and second carrier frequencies "$f_1$" and "$f_2$" may be converged to first and second increased or changed carrier frequencies "$f_1 + \Delta f_1$" and "$f_2 + \Delta f_2$", respectively, where the sum of increased components "$\Delta f_1$" and "$\Delta f_2$" is equal to the aforementioned change amount "$\Delta f$" ($\Delta f = \Delta f_1 + \Delta f_2$).

Although the invention has been described with respect to specific embodiment for complete and clear disclosure, the appended claims are not to be thus limited but are to be construed as embodying all modifications and alternative constructions that may occur to one skilled in the art which fairly fall within the basic teaching set forth herein.

What is claimed is:

1. A local oscillation frequency synthesizer, comprising:

first and second PLL synthesizers for generating first and second frequency signals;

a signal coupler for combining said first and second frequency signals to provide an output frequency signal; and means for controlling said first and second PLL synthesizers to change said first and second frequency signals by a frequency-change amount corresponding to a change-over of channels, a frequency of said first frequency signal being changed for a predetermined time period by said frequency-change amount, said first frequency signal being restored to its original frequency after being changed by said frequency-change amount, a frequency of said second frequency signal being changed by said frequency-change amount at a predetermined time after the frequency of said first frequency signal is changed by said frequency-change amount without restoring said second frequency signal to its original frequency.

2. A local oscillation frequency synthesizer, according to claim 1, wherein:

each of said first and second PLL synthesizers comprises:

a reference frequency signal generator for generating a reference frequency signal;

a voltage controlled oscillator for generating a signal having a frequency which is dependent on a voltage applied thereto;

a frequency division circuit for dividing said signal of said frequency supplied from said voltage controlled oscillator by a predetermined division ratio;

a phase comparator for comparing phases of said reference frequency signal and a divided signal supplied from said frequency division circuit to generate a phase difference signal;

a charge pump for receiving said phase difference signal to generate a charge pump output signal; and a loop filter for receiving said charge pump output signal to apply a voltage of said charge pump output signal to said voltage controlled oscillator; and said controlling means controls said first and second PLL synthesizers, whereby said predetermined time for said second frequency signal is set, such that a lowest level in a vibration of said first frequency signal and a highest level in a vibration of said second frequency signal occur at the same time.

* * * * *